United States Patent
Morrison et al.

(10) Patent No.: US 9,652,055 B2
(45) Date of Patent: May 16, 2017

(54) LAYER STACK FOR A TOUCH PANEL AND METHOD FOR FORMING A LAYER STACK

(71) Applicant: APPLIED MATERIALS, INC., Santa Clara, CA (US)

(72) Inventors: Neil Morrison, Darmstadt (DE); Thomas Deppisch, Aschaffenburg (DE); Hans-Georg Lotz, Gruendau-Rothenbergen (DE)

(73) Assignee: Applied Materials, Inc., Santa Clara, CA (US)

(*) Notice: Subject to any disclaimer, the term of this patent is extended or adjusted under 35 U.S.C. 154(b) by 391 days.

(21) Appl. No.: 14/142,036

(22) Filed: Dec. 27, 2013

(65) Prior Publication Data

US 2015/0107885 A1  Apr. 23, 2015

(30) Foreign Application Priority Data

Oct. 18, 2013  (EP) .................................... 13189384

(51) Int. Cl.
| | | |
|---|---|---|
| H05K 1/03 | (2006.01) | |
| G06F 3/044 | (2006.01) | |
| G06F 3/0354 | (2013.01) | |
| G06F 3/041 | (2006.01) | |
| H05K 1/02 | (2006.01) | |

(52) U.S. Cl.
CPC .......... *G06F 3/03547* (2013.01); *G06F 3/041* (2013.01); *G06F 3/044* (2013.01); *H05K 1/0274* (2013.01); *H05K 1/0306* (2013.01); *G06F 2203/04103* (2013.01); *H05K 2201/0137* (2013.01); *H05K 2201/0145* (2013.01)

(58) Field of Classification Search
CPC ............................................. G06F 2203/04103
See application file for complete search history.

(56) References Cited

U.S. PATENT DOCUMENTS

| | | | |
|---|---|---|---|
| 5,853,963 A * | 12/1998 | Singh ...................... | G03F 7/322 430/398 |
| 6,583,935 B1 * | 6/2003 | Saif ......................... | B32B 15/08 200/512 |
| 2011/0001717 A1 * | 1/2011 | Hayes ..................... | G06F 3/044 345/173 |
| 2012/0295071 A1 * | 11/2012 | Sato ........................ | G06F 3/041 428/188 |
| 2013/0265274 A1 * | 10/2013 | Liu .......................... | G06F 3/044 345/174 |

* cited by examiner

*Primary Examiner* — Ian Rummel
(74) *Attorney, Agent, or Firm* — Patterson & Sheridan, LLP (57) ABSTRACT

A layer stack for a touch panel is described. The layer stack includes a substrate including a polymer for depositing one or more layers on the substrate; a patterned transparent conductive oxide (TCO) layer provided over the substrate, which comprises areas of TCO and gaps between the areas of TCO; a first dielectric material provided in the gaps of the patterned TCO layer and a dielectric layer being deposited directly on the TCO areas of the TCO layer and directly on the first dielectric material. Further, a touch panel including a layer stack and a method for forming a layer stack for a touch panel is described.

12 Claims, 6 Drawing Sheets

LAYER STACK FOR A TOUCH PANEL AND METHOD FOR FORMING A LAYER STACK

TECHNICAL FIELD OF THE INVENTION

Embodiments of the present invention relate to a layer stack for a touch panel and a method for forming a layer stack for a touch panel. Embodiments of the present invention particularly relate to a layer stack for a touch panel including a TCO layer, specifically to a patterned TCO layer in a layer stack, and a method for forming a layer stack including a TCO layer.

BACKGROUND OF THE INVENTION

Touch panels or touch screen panels are a particular class of electronic visual display, which are able to detect and locate a touch within a display area. Generally, touch panels include a layer stack and are configured to sense a touch. The body of a touch panel should substantially be transparent, so that light in the visible spectrum emitted by the screen can be transmitted therethrough. At least some known touch panels include a transparent conductor formed over a substrate. A touch on the display area of such a panel generally results in a measurable change of capacitance in a region of the conductor. The change in capacitance may be measured using different technologies, so that the position of the touch can be determined.

A layer stack including a conductive layer for use with a touch panel is subject to some particular requirements. In particular, one key requirement is that the layer stack is stable enough for withstanding multiple contacts on the screen and harsh conditions, so that reliability of the touch screen is not compromised over time. However, at least some known layer stacks included in touch screens, which are considered robust, interfere with a proper transmission of light therethrough due to, for example, thickness, composition, and structure of the conductive layers. Furthermore, fabricating such a stable layer stack with high quality, for example with a uniform and defect-free barrier, is challenging.

Further, particular consideration of the optical characteristics, e.g. the appearance to a user, has to be taken into account for layer stacks, especially when the conductive layer for measuring the change in capacitance is a structured conductive layer. Thereby, a design of thin film based flat panel displays and touch screen technologies, which provides an invisible object, which is patterned with respect to conductivity (like a touch sensor structure) and which exhibits enhanced optical and electrical performance compared to conventional structures, is desired.

In view of the above, it is an object of the present invention to provide a layer stack for a touch panel, a touch panel and a method for forming a layer stack for a touch panel that overcomes at least some of the problems in the art and provides the desired properties.

SUMMARY OF THE INVENTION

In light of the above, a layer stack for a touch panel and a method for forming a layer stack for a touch panel according to the independent claims are provided. Further aspects, advantages, and features of the present invention are apparent from the dependent claims, the description, and the accompanying drawings.

According to one embodiment, a layer stack for a touch panel is provided. The layer stack includes a substrate including a polymer for depositing one or more layers and a patterned layer of a transparent conductive oxide provided over the substrate, which includes areas of transparent conductive oxide and gaps between the areas of transparent conductive oxide. A first dielectric material is provided in the gaps of the patterned layer of transparent conductive oxide. Further, the layer stack includes a dielectric layer being deposited directly on the areas of transparent conductive oxide of the layer of transparent conductive oxide and directly on the first dielectric material.

According to another embodiment, a method for forming a layer stack for a touch panel is provided. The method includes depositing a layer of transparent conductive oxide on a substrate comprising a polymer and patterning the layer of transparent conductive oxide so as to form gaps between areas of transparent conductive oxide. The method further includes filling the gaps of the patterned layer of transparent conductive oxide with a first dielectric material; removing the first dielectric material deposited directly on the areas of transparent conductive oxide of the patterned layer of transparent conductive oxide; and providing a dielectric layer directly on the area of transparent conductive oxide and directly on the first dielectric material.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 4b shows a sectional schematic view of the touch panel shown in

FIG. 4a from another side according to embodiments described herein;

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Figure 1:
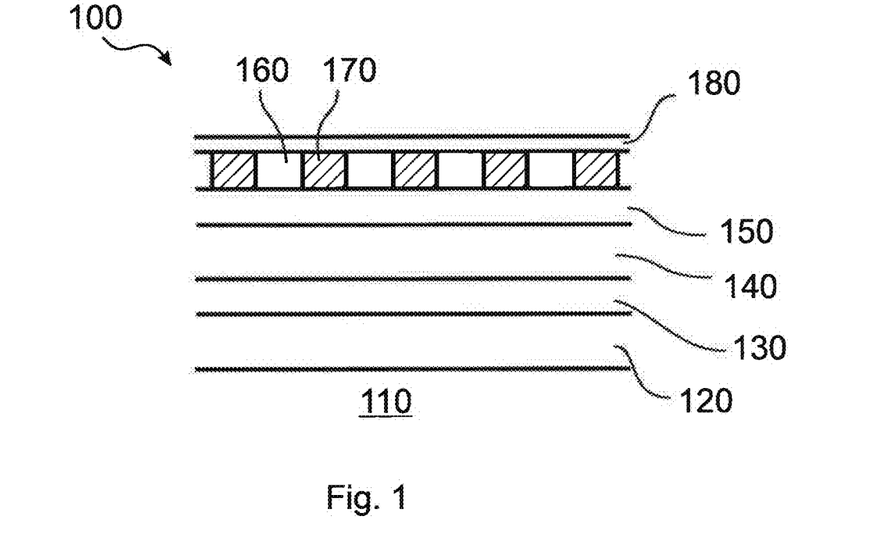
FIG. 1 shows a schematic view of a layer stack for a touch panel according to embodiments described herein.

FIG. 1 shows a layer stack 100 according to embodiments described herein. According to typical embodiments, a layer stack is constituted by a number of films formed (e.g., by deposition) one atop of another. Generally, the films or layers may be deposited on a substrate 110. The substrate as described herein may be a polymer substrate. The term "substrate" as used herein shall embrace both inflexible substrates, e.g., a rigid polymer substrate, and flexible substrates such as a web or a foil. In one embodiment, the substrate is a polymer foil, especially a PET foil.

According to some embodiments, the layer stack as described herein may be a layer stack for a touch panel, especially an anti-reflective layer stack for a touch panel. For being used in a touch panel, the layer stack according to embodiments described herein includes a patterned TCO (transparent conductive oxide) layer, which can be seen in FIG. 1 as TCO pattern 160. The pattern of the TCO layer may include areas of TCO and gaps between the areas of TCO. In FIG. 1, it can be seen that a material 170 is filled in the gaps of the TCO pattern. A dielectric layer 180 is deposited directly on the material 170 as well as directly on the TCO areas 160. According to some embodiments, the dielectric layer 180 may contain a second dielectric material. In one example, the dielectric layer may be described as being a top layer.

According to typical embodiments, which can be combined with other embodiments described herein, the transparent conductive oxide referred to herein may be an indium tin oxide (ITO) layer (e.g. crystalline ITO), a doped ITO layer, impurity-doped ZnO, $In_2O_3$, $SnO_2$ and CdO, ITO (In2O3:Sn), AZO (ZnO:Al), IZO (ZnO:In), GZO (ZnO:Ga), or multi-component oxides including or consisting of combination of ITO, doped ITO, impurity doped ZnO, In2O3, SnO2 and CdO, AZO, IZO, GZO.

Generally, larger sized projective capacitive touch panel sensors based on rugged, unbreakable, PET foil substrates, require a low sheet resistance TCO layer (such as a TCO layer having a sheet resistance of <150 Ohm/square or less), high optical and color neutral transmission in combination with the invisibility of the sensor elements after TCO patterning. For optimal device performance, a very thin ITO layer is required for the invisibility of the TCO layer. For instance, a thin layer thickness may be in the range of less than about 25 nm. Current process technologies and design integration schemes are limited at about 100 Ohm/square. A lower sheet resistance is not possible with the current layer architecture where a TCO is deposited on the top of the layer stack.

In the standard process flow of manufacturing a layer stack for a touch panel, the ITO layer is deposited as the last layer on the top of the layer stack. In an alternative known layer structure, the ITO layer is embedded within the layer system. This so called "buried ITO" allows thicker ITO layers with lower sheet resistance, relatively high optical and color neutral transmission with a patterned ITO layer. However, the reduced sheet resistance and the increased TCO layer thickness of the "buried ITO" results in the desire for further improvement of the layer stack as the, e.g. thicker, structured TCO layer tends to be more easily visible.

Further, in the known systems, an inferior sunlight readability, a colored appearance (reflectance) of the screen, a color change with respect to the produced picture from the underlying display, and a more or less visible pattern from the structured core layer of the functional screen (e.g. a patterned transparent conductive oxide, TCO) is often obtained. Also, the conductivity might not be sufficient for large area touch panels, e.g. touch panels with a diagonal of 7 inch or above, specifically for touch screens with a diagonal of more than 20 inch.

To improve the optical appearance of the touch panel, while, at the same time, providing a layer with a low surface resistance, it has been found by the inventors to use a TCO layer within an antireflection layer stack. According to embodiments described herein, the gaps between the TCO pattern are filled with a first dielectric material, especially a first dielectric transparent material. In particular, the first dielectric material may provide the same or similar optical parameters (such as refractive index n or extinction coefficient k) as the TCO pattern. In FIG. 1, the first dielectric material 170 can be seen in the gaps of TCO pattern 160. According to some embodiments, the patterned TCO layer together with the first dielectric material behaves optically like a closed film without pattern structure. This behavior allows applications within antireflection coating stacks. In some embodiments, the gaps in the TCO pattern are filled with a first dielectric material before a second dielectric material is deposited directly on the TCO pattern and directly on the first dielectric material.

In one embodiment, the first dielectric material being filled into the gaps of the TCO layer may have the same or similar optical characteristics as the TCO layer. For instance, a characteristic may be denoted as being "similar", if the value of the described characteristic deviates from the similar value by up to about 15%.

In the case that ITO is used as TCO in one embodiment, the refractive index of the first dielectric material may by about $n=2.0$ to about $n=2.35$. The refractive index of the first dielectric material may deviate by up to 15% about the value of the refractive index n. The extinction coefficient of the first dielectric material k may be about $2.11\ e^{-1}$ and may contain a deviation of 15% about the value of the extinction coefficient k. Other optical characteristics of the first dielectric material being similar or the same as the optical characteristics of the TCO may contain the chromatic dispersion dn/R being about $0.471\ \mu m^{-1}$ and the absorption coefficient a being $1.0623e+5\ cm^{-1}$, whereby each of these values may include a deviation of about 15% for being similar to the respective values of the TCO layer.

The first dielectric material filled in the gaps of the TCO pattern may be chosen in dependence on the TCO material, especially in dependence on the optical characteristics of the TCO material. According to some embodiments, the first dielectric material for filling the gaps between the TCO pattern may for instance be material with the chemical formula $SiN_xO_y$. In some embodiments, the first dielectric material may contain $Si_3N_4$, $Ta_2O_5$, $ZrO_2$, ZnO, and/or $SnO_2$.

Due to the structure of the layer stack according to embodiments described herein, it is facilitated that the conductive film does not prejudice an optimal transmission of light through the body. In particular, a layer stack according to embodiments herein facilitates that a conductive film, even a structured conductive film, does not have a negative impact on the transmission of light and avoids undesired reflectance properties.

One embodiment of an anti-reflection layer stack for a gap filled TCO layer is shown in FIG. 1. Beside the above described substrate 110, the TCO pattern 160, the first dielectric material 170 in the gaps of the TCO pattern, and the dielectric layer 180 being formed from a second dielectric material, the layer stack 100 may include an adhesion layer 120, e.g. for improving the adhesion of the following layers on the substrate, for serving as a seed layer for the following layers, a barrier layer to the substrate or the like. The adhesion layer 120 may contain a silicon oxide, such as $SiO_x$. For instance, the adhesion layer may contain $SiO_2$ or SiO. According to some embodiments, the adhesion layer may be a thin layer. A thin adhesion layer may provide a layer thickness of about 25 nm.

The exemplarily shown layer stack 100 may include materials with high and low refractive indexes (such as SiOx, TiOx, NbOx, SiNx, SiOxNy, AlOx, AlOxNy, MgF2, TaOx). For instance, a first high refractive index layer 130, a low refractive index layer 140, and a second high index layer 150 are provided between the adhesion layer and the TCO layer.

In one embodiment, which may be combined with other embodiments described herein, the high refractive index layer (or just high index layer) 130 or 150 may have a refractive index of larger than 1.8. For example, a niobium-oxide containing film may be deposited as a high refractive index layer. Films having a high refractive index may for instance be provided by films containing NbOx, SiNx, SiOxNy, AlOxNy, TiOx, TaOx, $ZrO_x$ or the like. According to some embodiments, the niobium-oxide containing film may have the chemical formula like $Nb_xO_y$, such as $Nb_2O_5$.

According to some embodiments, films having a low refractive index can be provided by films containing $SiO_x$, $MgF_x$, $SiO_xN_y$, or the like, such as $SiO_2$. A layer being described as being a low refractive index layer or just a low index layer may have a refractive index lower than 1.6 in one embodiment, which may be combined with other embodiments described herein.

According to some embodiments described herein, the second dielectric material in the dielectric layer as described herein may be a different dielectric material than the first dielectric material being provided in the gaps of the TCO pattern. In one embodiment, which may be combined with other embodiments described herein, the dielectric layer may include a low index material as described above. For instance, the dielectric layer may contain $SiO_2$. The dielectric layer being a low index layer may not only passivate the thereunder arranged layer stack, but may also contribute to making the layer stack an anti-reflective layer stack. In some embodiments, the same dielectric material may be used for the first and the second dielectric material.

According to some embodiments, which may be combined with other embodiments described herein, the dielectric layer (such as dielectric layer 180 described in FIG. 1 and below dielectric layer 280 described in FIG. 2e) may be formed as a "graded index" layer. In the graded index layer, the refractive index of the material in the layer may shift from a first value to a second value. In one embodiment, the refractive index of the graded index layer may shift continuously or in steps. For instance, the refractive index of the dielectric layer may have a refractive index ranging from the refractive index of the TCO layer to the refractive index of SiO2, such as ranging from the refractive index 2.0 (being the refractive index of ITO) at the side, which contacts the ITO layer, over a refractive index of SiOxNy (n=1.9), SiOxNy (n=1.8) and so on to the refractive index of SiO2 (n=1.46).

Furthermore, in the following description, a layer or film may be understood as an amount of material deposited. In particular, the material amount may be deposited on a substrate or on another layer to form a layer having a defined thickness. According to some embodiments, a layer may be defined as an amount of material being deposited on another material. A layer may be formed by the mere deposition of the amount of material, by the deposition of the material and a subsequent processing (such as etching, leveling, an imprint method or the like), or by the composition of more than one material being deposited and processed in a defined way. For instance, a patterned material and a material being filled in the gaps of the pattern for having a uniform optical appearance may together form a layer. In particular, the layer formed by a pattern and a filling in the gaps of the pattern may have a substantially uniform thickness and may be denoted as one layer. Nevertheless, in accordance with the above description of a layer on a material, a material being deposited on a patterned layer filling the gaps and being provided on the pattern may also be denoted as a layer.

Figure 2A:
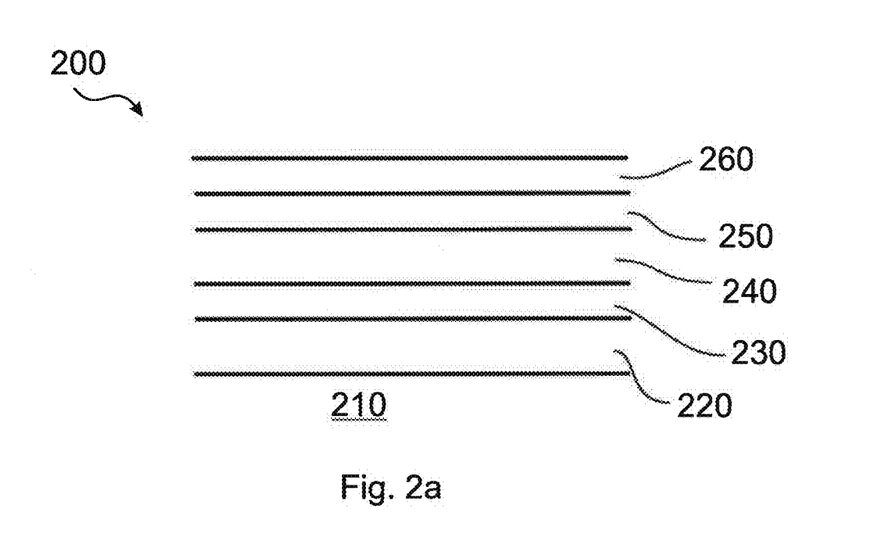
FIGS. 2a-2e show schematic representations of the manufacturing of an exemplary layer stack for a touch panel according to embodiments described herein.

In FIGS. 2a to 2e, an example is shown for forming the layer stack as described in FIG. 1. In FIG. 2a, a layer stack 200 contains a substrate 210, an adhesion layer 220, a first high refractive index layer 230, a low refractive index layer 240 and a second high refractive index layer 250. According to some embodiments, the described layers in the FIGS. 2a to 2e may be layers as described with respect to FIG. 1. For instance, the materials and characteristics of the layers described in FIGS. 2a to 2e may be the same as described with respect to FIG. 1 (e.g. optical characteristics).

In the embodiment shown in FIG. 2a, a TCO layer 260 is deposited on the second high refractive index layer 250. The TCO layer 260 may have a thickness of typically between about 25 nm and about 90 nm, more typically between about 30 nm and about 70 nm, and even more typically between about 40 nm and about 60 nm. In one example, the thickness of the TCO layer may be about 50 nm.

Although not explicitly shown, the layer stack 200 as shown in FIG. 2a may further include a contact layer deposited on the TCO layer in some embodiments, which may be combined with other embodiments described herein. The contact layer may include a metal, such as copper. For instance, the contact layer may be provided for being able to use the formed layer stack according to embodiments described herein in a touch panel arrangement. The contact layer may be formed and used to provide a contact to the TCO layer, or patterned TCO layer as will be described in detail below. Alternatively, an Ag paste may be provided in the touch panel for contacting the TCO layer.

Figure 2B:
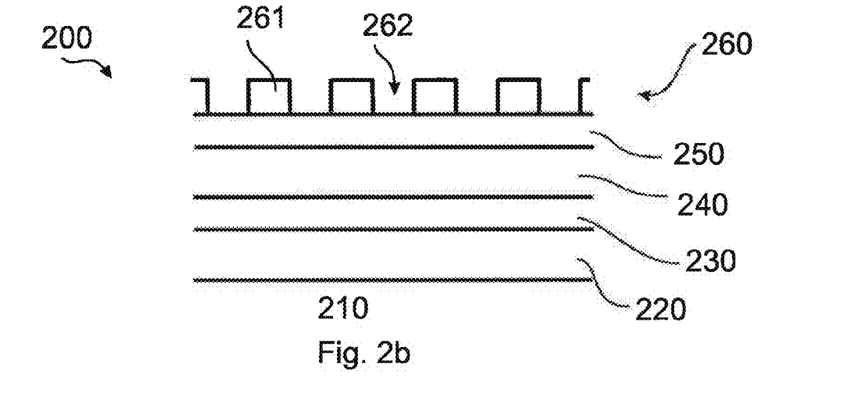

FIG. 2b shows the layer stack 200 as shown in FIG. 2a, but with a patterned TCO layer 260. The pattern may include areas 261 of TCO material and gaps 262 between the areas 261 of TCO material. According to some embodiments, the gaps 262 between the TCO areas 261 substantially do not contain TCO material. For forming the TCO pattern, the TCO layer 260 may be etched or processed by a similar process, for instance, by using a mask providing the negative of the desired pattern. According to some embodiments, also the contact layer contact layer may be patterned or parts thereof may be removed in order to form the desired layer stack for a touch panel and/or contact lines for the touch panel.

According to some embodiments, the patterning of the TCO layer 260 may be performed by an imprint method, in particular by a multilevel imprint method (e.g. when copper shall be etched too). For instance, the multilevel imprint method may include coating the layer to be patterned (such as layer 260 in this embodiment) by a polymer coating, embossing the polymer coating, curing the embossed polymer coating, e.g. by the use of UV light, exposing the embossed polymer coating by releasing the embossing structure, and etching the pattern by using the polymer coat as a mask. Thereby, the above described pattern including areas of TCO and gaps between the areas of TCO may be formed.

According to some embodiments, the TCO layer may have a surface resistance of about 150 Ohm/square or less. In one embodiment, the surface resistance of the TCO layer is typically less than 100 Ohm/square, more typically less than about 80 Ohm/square, and even more typically less than about 70 Ohm/square. In one example, the TCO layer provides a surface resistance of about 50 Ohm/square.

Generally, the structured TCO pattern, e.g. lines of TCO, corresponds to a line resistance in Ohm. However, the sheet resistance is the relevant parameter and can be determined by deposition of test areas or can be determined or calculated based upon the resistance of patterned structures and the structure geometry. Accordingly, even though the sheet resistance of the structure layer cannot be directly determined (yet indirectly) and rather refers to the resistance of an unstructured layer, a person skilled in the art would relate to a sheet resistance corresponding to a value for the structured layer.

Figure 2C:
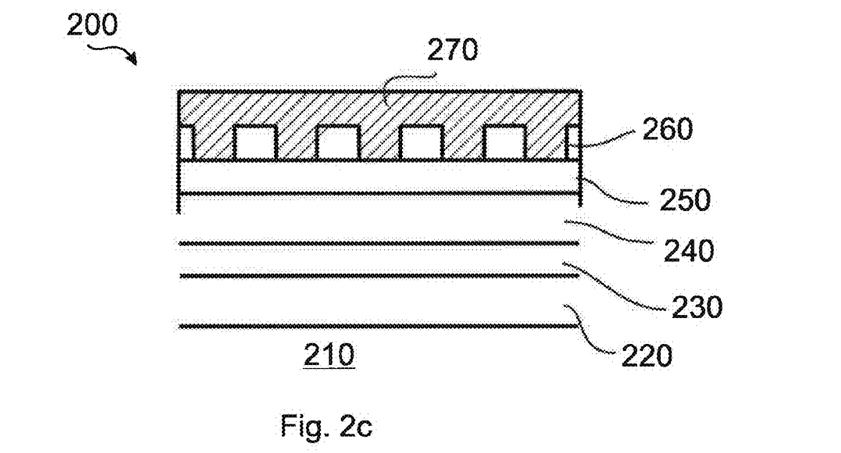
Figure 2D:
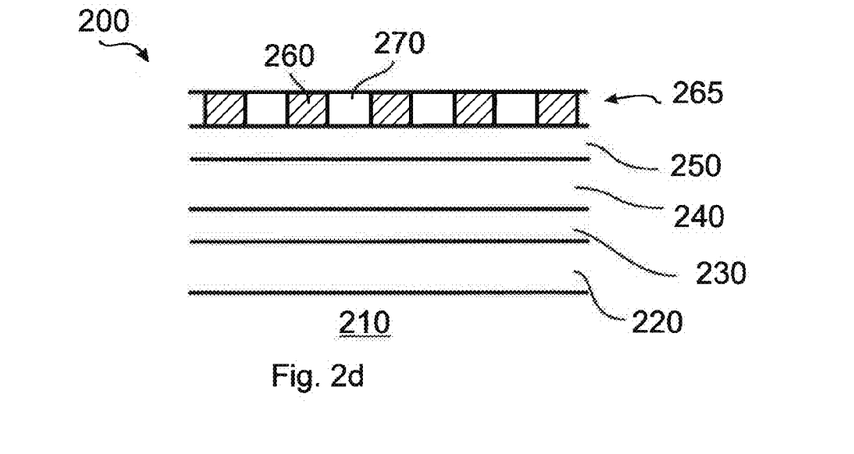
Figure 2E:
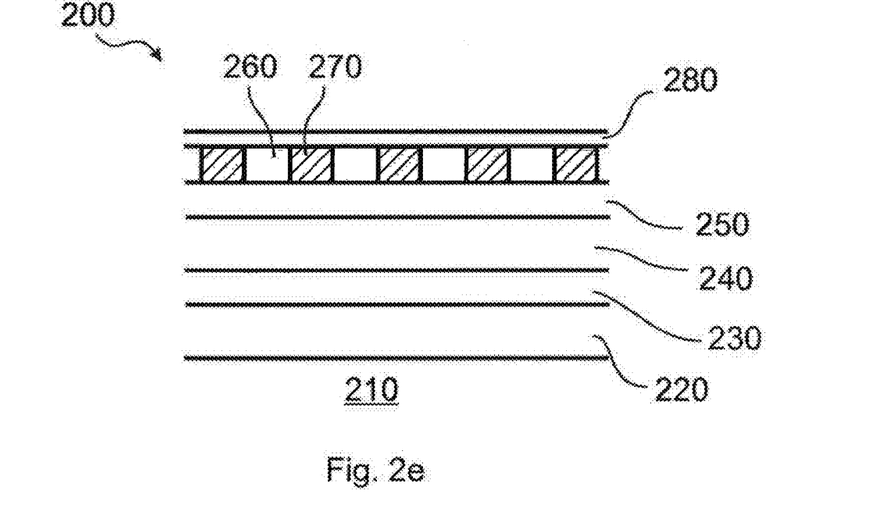
Figure 3:
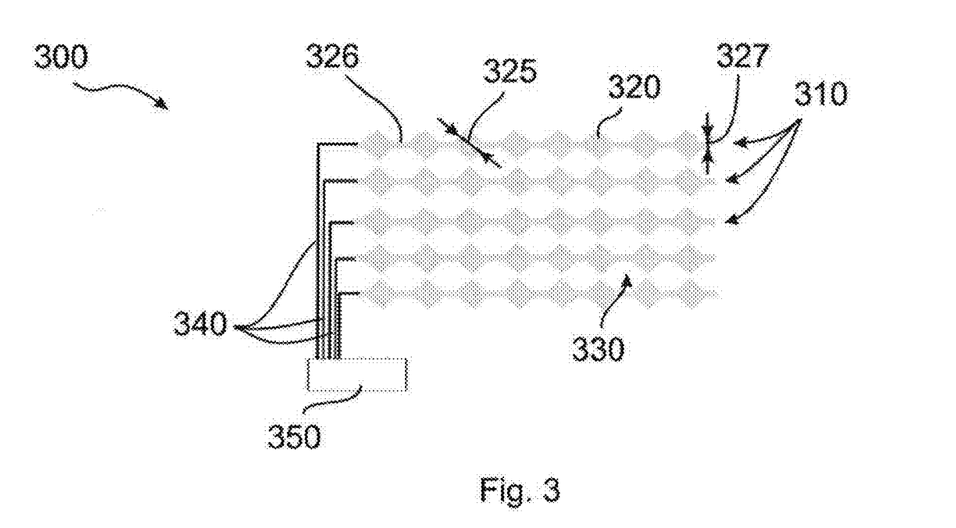
FIG. 3 shows a schematic drawing of a patterned TCO layer provided in a layer stack according to embodiments described herein.

While FIGS. 2a to 2e show a simple pattern of stripes or squares as areas of TCO, FIG. 3 shows a further example of a layer including a TCO pattern. The TCO layer 300 has TCO areas 320 and gaps 330 between the TCO areas 320. As can be seen in FIG. 3, the pattern of the TCO may connect the TCO areas 320 in one direction and may provide substantially no connection between the TCO areas 320 in another direction. For instance, rows 310 of TCO areas 320 are formed by connecting the TCO areas 320, whereas substantially no connection is provided between the rows 310. In the example shown in FIG. 3, the TCO pattern includes rhomb-like TCO areas; however, the herein described TCO pattern is not limited to the shown pattern and may provide differently shaped TCO areas, such as TCO areas having the shape of stripes, a rectangular shape, a quadratic shape, a triangular shape, a polygon shape, or any shape suitable for being used for a TCO layer in a touch panel. According to some embodiments, the TCO areas may have a diameter of typically between about 1 mm and about 7 mm, more typically between about 2 mm and about 6 mm, and even more typically between about 3 mm and about 5 mm. In one embodiment, the diameter of a TCO area (indicated by the reference sign 325 in FIG. 3) may be 3 mm. It should be understood that the term "diameter" depends on the form of the TCO areas, and may also be defined by one dimension of the TCO area in one direction. According to some embodiments, and as already explained above, the TCO areas may be connected by paths (such as paths 326). In one embodiment, the path 326 connecting TCO areas 320 in one direction so as to form rows 310 may have a width 327 of about 1 mm.

FIG. 3 further shows copper lines 340 being in touch with the TCO pattern. According to some embodiments, the copper lines 340 connect the TCO pattern with a controller 350. For instance, the controller 350 may detect a difference in the current being passed by the TCO pattern and the copper lines, and being induced by touching the touch screen.

Referring back to FIGS. 2a to 2e, the patterned TCO layer 260 is covered by a first dielectric material 270 in FIG. 2c. The first dielectric material 270 may have the same characteristics as the first dielectric material as described in FIG. 1, such as having similar or the same optical characteristics as the TCO layer 260. The deposition of the first dielectric layer 270 fills the gaps 262 of the TCO pattern.

According to some embodiments, the first dielectric material is deposited covering the TCO layer as shown in FIG. 2c and in a further step (shown in FIG. 2d), the first dielectric material being above the TCO pattern 260 (or above the defined thickness of the TCO pattern) is removed. According to some embodiments, the first dielectric material 270 on top of the TCO layer 260 is removed by an etching step.

It should be understood that the figures shown in the drawings do not show a correct scale of dimensions. For instance, the layer 270 of a first dielectric material may be substantially as thick as the TCO layer and may provide particles of the first dielectric material on the TCO pattern due to the deposition process, before removing the parts or particles of the layer 270 being provided above the TCO pattern. After the processing step performed in FIG. 2d, i.e. after removal of the first dielectric material from the TCO pattern, the layer of the first dielectric material 270 may have substantially the same thickness as the TCO layer 260, such as a thickness of about 50 nm. According to some embodiments, the TCO pattern 260 and the first dielectric material 270 may form a layer 265 having a substantially uniform thickness.

In FIG. 2e, a dielectric layer 280 is deposited directly on the TCO areas and directly on the first dielectric material 270. According to some embodiments, the dielectric layer 280 may include a second dielectric material, which may be different from as the first dielectric material, or may be a low index material as described above. For instance, the dielectric layer may include $SiO_x$, such as $SiO_2$.

It should be understood that the term "a layer is directly deposited on a material" or "a layer is directly deposited on another layer" refers to the situation, where substantially no further layer is deposited between the layers or materials being deposited directly on one another. However, there may be contaminations, particles or remains of other materials previously provided on a layer, which may be between the two layers, without disturbing the direct provision of one layer on the other. According to some embodiments, the contaminations between two layers being directly provided on one another may occupy up to 15% of the surface area of the layers being provided directly on one another. In one embodiment, providing a first material directly on a second material may mean that at least about 85% of the second material is in direct contact with the first material. For example, the dielectric layer being deposited directly on the areas of TCO as described herein, may mean that 85% or more of the surface of the TCO areas are directly covered by the dielectric layer. According to some embodiments, all TCO areas present in the TCO pattern are directly covered by the second dielectric material. The same applies in the concrete example for the first dielectric material in the TCO gaps, whereby the dielectric layer as described herein is provided or deposited directly (or in contact with) the first dielectric material.

According to some embodiments, in particular according to embodiments including a contact layer, the dielectric layer 280 may be subjected to an imprint step (such as an imprint method as described above) to uncover the contact layer, or contact pattern to be able to contact the conductive structure.

Figure 4A:
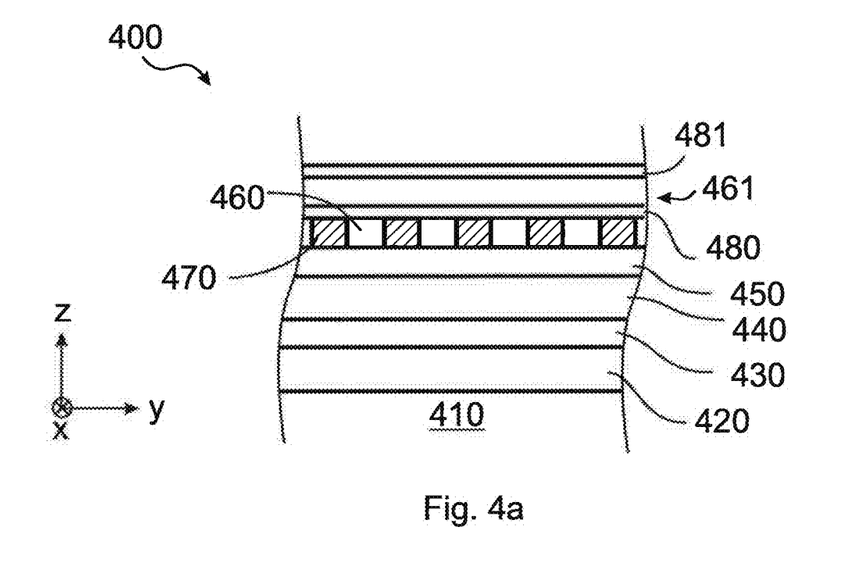
FIG. 4a shows a sectional schematic view of a touch panel including a layer stack according to embodiments described herein.

FIG. 4a shows a sectional view of an example of a layer structure in a touch panel according to embodiments described herein. The layer structure 400 for a touch panel may include a flexible substrate 410, an adhesion layer 420, a first high index layer 430, a first low index layer 440, and a second high index layer 450. The layer structure 400 of the touch panel further includes a TCO pattern 460 having areas of TCO and gaps between the areas of TCO. The gaps between the areas of TCO are filled with a first dielectric material 470. According to some embodiments, the materials of the layer may correspond to the materials in the above described layers in the layer stacks of FIGS. 1 and 2a to 2e. For instance, the pattern of the TCO layer may be formed by an imprint method as mentioned above. In one embodiment, a contact layer (such as a copper layer) may also be formed in the stack for contacting the TCO layer. Alternatively, an Ag paste may be provided for providing busbars.

The sectional view of a touch panel shown in FIG. 4a also includes a layer 480 containing a second dielectric material being provided directly on the first dielectric material 470 in the gaps of the TCO pattern and directly on the TCO areas of the TCO pattern 460. The layer 480 may be denoted as an isolating layer. In one embodiment, the layer 480 includes $SiO_2$.

According to some embodiments, the touch panel 400 includes a layer 461 and layer 481. The layer 461 may substantially be provided like the layer 460. For instance, the layer 461 may be a second TCO layer and layer 481 may be a second dieletric layer. This may for instance mean that layer 461 may contain a TCO pattern including areas of TCO and gaps between the areas of TCO, which are filled with a dielectric material, such as the first dielectric material as described above, which may include $Si_3N_4$, $Ta_2O_5$, $ZrO_2$, $ZnO$, $SnO_2$ or materials having the formula $SiN_xO_y$. According to some embodiments, the TCO pattern 460 of FIG. 4a is provided by lines of TCO running substantially in the x-direction, while the TCO pattern in layer 461 includes lines running substantially in the y-direction as indicated in the coordinate system on the left side of FIG. 4a.

Figure 4B:
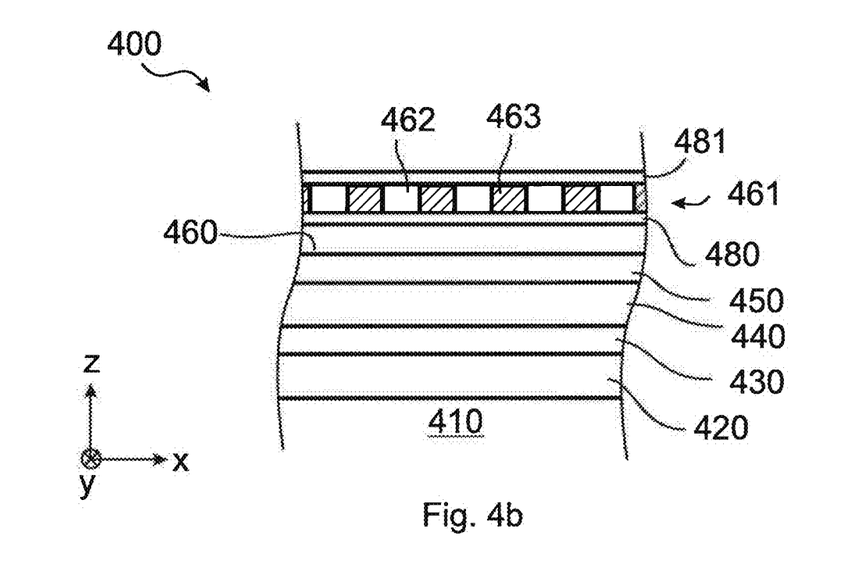

In FIG. 4b, the sectional view of the touch panel 400 is shown in a perspective after a 90 degree turn, as can be seen in the coordinate system shown beside FIGS. 4a and 4b. In FIG. 4b, the structure of the layer 461 can be seen including a TCO pattern having TCO areas 462 and gaps between the TCO areas 462. According to embodiments described herein, the gaps between the areas 462 of TCO are filled with a dielectric material 463, such as the first dielectric material described above.

With the structure shown in FIGS. 4a and 4b, a capacitive touch panel may be provided. The touch panel may use the sensing of a capacitance variation between the two layers 460 and 461 in FIGS. 4a and 4b. According to some embodiments, the layers 460 and 461 may also be denoted as conductive layers. The two conductive layers may be arranged parallel to each other and may be spaced by an isolator layer (such as layer 480). When electric current is applied (e.g. by contact lines as described above being exemplarily formed of copper); a field of stored electrons is achieved between the conductive layers. When a finger or a suitable stick touches the touch panel or is just close in proximity to the panel, the value of capacitance between the two conductive layers will be affected and varied. By sensing this variable (e.g. due to a controller), the location of touch can be indicated, such as by a linked controller customized algorithm.

Figure 5:
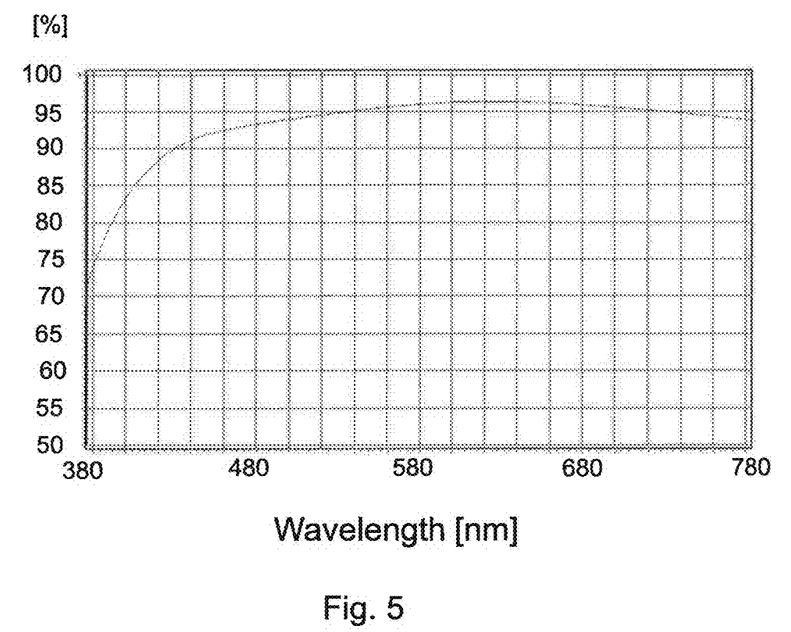
FIG. 5 shows a schematic representation of the optical behavior of a layer stack according to embodiments described herein.

FIG. 5 shows a schematic diagram of the optical behavior of a layer stack according to embodiments described herein. The layer stack of which the optical behavior is shown in FIG. 5 contains a patterned TCO layer having a thickness of about 50 nm. On the axis of abscissa, the wavelength is indicated ranging from about 380 nm to about 780 nm. The axis of ordinates shows the transmission behavior of the layer stack in percent of the incident light. The skilled person will recognize from the diagram of FIG. 5 that the transmission at a wavelength from about 430 nm to about 780 nm is above 90%, and at a wavelength from about 540 nm to about 740 nm above 95%. The layer stack according to embodiments described herein therefore provides an enhanced optical transmittance compared to known systems. Also, the layer stack according to embodiments described herein provides a low surface resistance of about 50 Ohm/square, e.g. by providing a relatively thick TCO layer in the layer stack.

Figure 6:
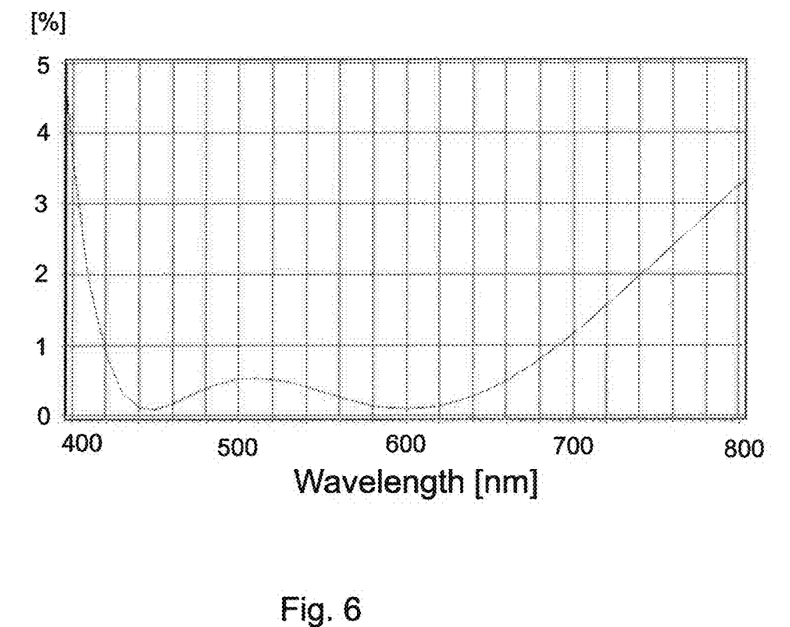
FIG. 6 shows a schematic representation of the optical behavior of a layer stack according to embodiments described herein.

FIG. 6 shows a schematic diagram of the optical behavior of a layer stack according to embodiments described herein. The layer stack of which the optical behavior is shown in FIG. 6 contains a patterned TCO layer having a thickness of about 50 nm. On the axis of abscissa, the wavelength is indicated ranging from about 400 nm to about 800 nm. The axis of ordinates shows the reflection behavior of the layer stack in percent of the incident light. The skilled person will recognize from the diagram of FIG. 6 that the reflection at a wavelength from about 440 nm to about 660 nm is below 0.5%, and at a wavelength of about 440 nm and about 600 nm below 0.2%. The layer stack according to embodiments described herein may therefore act as an anti-reflection layer stack in a touch panel, while at the same time providing a reliable conductive layer having a defined surface resistance.

Figure 7:
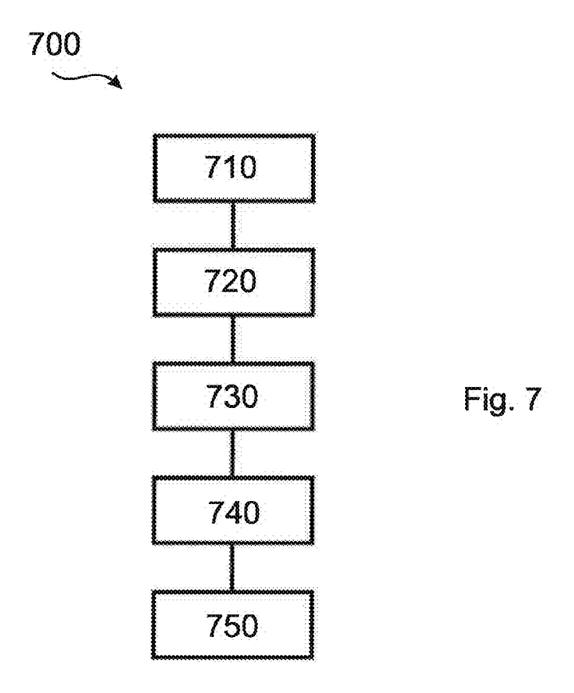
FIG. 7 shows a flow chart of a method of forming a layer stack for a touch panel according to embodiments described herein.

FIG. 7 shows a flow chart of a method 700 for forming a layer stack for a touch panel according to embodiments described herein. The method 700 includes in box 710 depositing a TCO layer on a substrate. For instance, the substrate may include a polymer. According to some embodiments described herein, the substrate may be a web, a foil, or a flexible substrate. In one embodiment, the substrate to be coated is a PET substrate, especially a PET foil. In box 720, the TCO layer deposited on the substrate is patterned. The patterning may be performed by an etching step, by a multilevel imprint method or the like. According to embodiments described herein, the pattern of the patterned TCO layer includes areas of TCO and gaps between the areas of TCO.

According to some embodiments described herein, which may be combined with other embodiments described herein, the substrate to be coated may be a web, but may also include a large area substrate. In some embodiments, the substrate may be GEN 4.5, which corresponds to about 0.67 m2 substrates (0.73×0.92 m), GEN 5, which corresponds to about 1.4 $m^2$ substrates (1.1 m×1.3 m), GEN 7.5, which corresponds to about 4.29 $m^2$ substrates (1.95 m×2.2 m), GEN 8.5, which corresponds to about 5.7 $m^2$ substrates (2.2 m×2.5 m), or even GEN 10, which corresponds to about 8.7 $m^2$ substrates (2.85 m×3.05 m). Even larger generations such as GEN 11 and GEN 12 and corresponding substrate areas can similarly be implemented.

According to some embodiments, the method 700 further includes box 730, in which the gaps of the patterned TCO layer are filled with a first dielectric material. The first dielectric material may have the same or at least similar optical characteristics as the TCO layer. For instance, the first dielectric material may be a first dielectric material as described above with respect to FIGS. 1 and 2a to 2e; in particular, the first dielectric layer may have the same or a similar extinction coefficient k and/or the same or a similar refractive index n as the TCO used in the TCO pattern.

In box 740, the method 700 for forming a layer stack for a touch panel includes removing the dielectric material deposited directly on the TCO areas of the patterned TCO layer. In one embodiment, the filling of the gaps between the areas of TCO is performed as described in FIGS. 2c and 2d, i.e. by providing the first dielectric material between and above the TCO layer. Subsequently, the first dielectric material being provided above the TCO areas may be removed so that the first dielectric material is only present in the gaps between the TCO areas and not above the TCO areas. According to some embodiments, the first dielectric material is thus formed with a thickness corresponding to the thickness of the TCO layer. For instance, the thickness of the TCO layer and the first dielectric material may typically be between about 25 nm and about 90 nm, more typically between about 30 nm and about 70 nm, and even more typically between about 40 nm and about 60 nm. In one example, the thickness of the TCO layer may be about 50 nm.

According to embodiments described herein, box 750 of method 700 includes providing a dielectric layer directly on the TCO area and directly on the first dielectric material. The direct deposition of one layer on another layer may be performed as described and defined above. For instance, providing a first material directly on a second material may mean that about 85% of the second material is in direct contact with the first material. For example, the dielectric layer being deposited directly on the areas of TCO as described herein, may mean that 85% or more of the surface of the TCO areas are directly covered by the dielectric layer. The same applies in the concrete example for the first dielectric material in the TCO gaps, whereby the dielectric layer as described herein is provided or deposited directly (or in contact with) the first dielectric material.

According to some embodiments, the deposition of a material on a polymer substrate may take place at a temperature of typically less than about 150° C., more typically less than about 120° C., and even more typically less than about 100° C. In one embodiment, the layer deposition as described herein, in particular the layer deposition of the TCO material, may take place at a temperature of about 80° C., especially in the case that a PET foil is used as a substrate. The deposition of the herein described layers may be performed by a sputter process, e.g. a sputter process using a target or a rotatable target.

In one embodiment, the method for forming a layer stack for a touch panel includes depositing an adhesion layer directly on the substrate before depositing the TCO layer. The adhesion layer may serve to improve the adhesion of the subsequently formed layers on the substrate, but may also provide the characteristic of a barrier layer as well as an isolating layer. In one embodiment, the adhesion layer may include material including $SiO_x$, such as $SiO_2$. The adhesion layer may be a thin layer having a thickness of about 25 nm or less. After depositing the adhesion layer, a first high refractive index layer may be formed on the adhesion layer. The first high refractive index layer may include material having a high refractive index being higher than 1.8. For instance, the material having a high refractive index may include $Nb_xO_y$, such as $Nb_2O_5$. On the first high refractive index layer, a first low refractive index layer may be deposited. In one embodiment, the low refractive index layer may include a material having a refractive index of lower than 1.6. For instance, the first low refractive index layer may include a material such as SiO2. On the low refractive index layer, a second high refractive index layer may be formed in one embodiment. The second high refractive index layer may be a layer similar to the first low refractive index layer, e.g. providing the same material and/or the same or similar material characteristics compared to the material of the first high refractive index layer. According to some embodiments, the above described deposition of the TCO layer may be performed on the second high refractive index layer.

Figure 8:
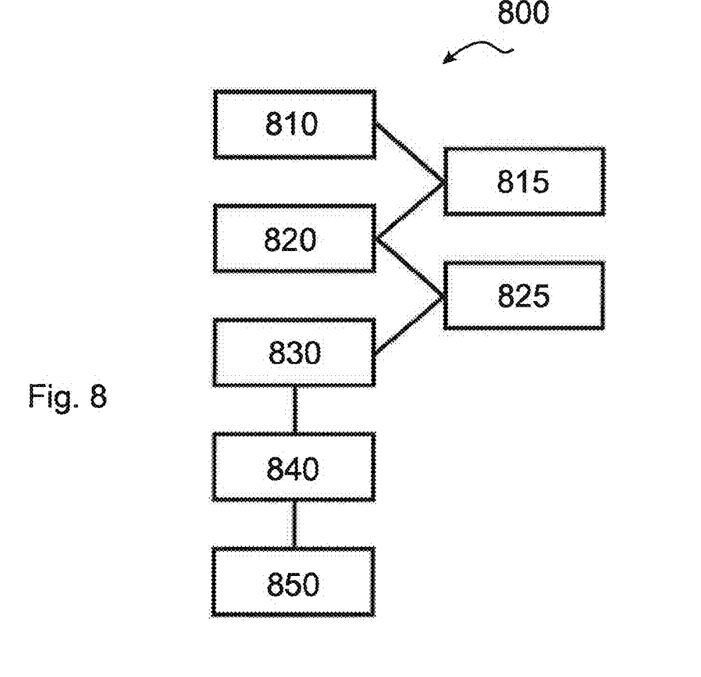
FIG. 8 shows a flow chart of a method of forming a layer stack for a touch panel according to embodiments described herein.

FIG. 8 shows a flowchart 800 of an embodiment of a method for forming a layer stack for a touch panel. Generally, the boxes 810, 820, 830, 840, and 850 may correspond to the boxes 710, 720, 730, 740, and 750 of method 700, respectively. The method 800 includes further, after depositing a TCO layer on a substrate including a polymer in box 810, depositing a contact layer on the TCO layer in box 815. The contact layer may be deposited before patterning the TCO layer in box 820. In one embodiment, the contact layer may include a copper layer.

In box 825, which may be performed after box 820, the contact layer may be patterned before filling the gaps of the patterned TCO layer with the first dielectric material. According to some embodiments, the patterning of the contact layer and the TCO layer may be performed simultaneously. After patterning the contact layer, the first dielectric material may be filled in the gaps between the TCO areas in box 830 and the dielectric material deposited directly on the TCO areas of the patterned TCO layer may be removed from the TCO areas in box 840 so as to have a uniform layer including the TCO pattern and the dielectric material filling. Box 850 may include providing a dielectric layer directly on the TCO area and directly on the first dielectric material as described above.

According to some embodiments, in which copper is used as a contact possibility and deposited on the TCO layer, the method of forming a layer stack for a touch panel may include a two-level imprint or other lithographic methods for patterning the TCO layer and the contact layer. After the two-level imprint method, the contact layer is etched (so as to form a pattern). In one embodiment, the TCO is etched after the contact layer etching in order to form the TCO pattern. The etched pattern, as described above, may contain TCO areas and gaps between the TCO areas. Subsequently, the first dielectric material is filled into the gaps between the TCO areas, wherein, in particular, the first dielectric material has an identical refractive index and/or an identical extinction coefficient as the TCO (e.g. a material having the formula $SiN_xO_y$). After the deposition of the first dielectric material, a second imprint method or corresponding lithographic method is used. Subsequently, the deposited first dielectric material is etched, in particular to remove the first dielectric material present on the TCO areas, and, further in particular, to form a closed layer including the TCO pattern and the first dielectric material having a uniform optical appearance. After the etching of the first dielectric material, a low refractive index layer, such as a dielectric layer, which may include $SiO_2$ may be deposited on the closed layer including the TCO pattern and the first dielectric material, processed by a third imprint method or a corresponding lithographic method, and etched. For instance, the dielectric layer may be etched in order to expose the contact layer or contact pattern (which may be provided as connecting lines), in particular, to expose the contact pattern to be able to contact the TCO layer via the contact lines, which may be (as for instance shown in FIG. 3) connected to a controller.

According to embodiments described herein, the patterned TCO layer together with the first dielectric material behaves optically like a closed film without pattern structure. The areas of TCO and the dielectric material filled in the gaps form an optically uniform layer. In particular the film formed by the TCO areas and the dielectric filling between the TCO areas may have a thickness of typically about 25 nm and about 90 nm, more typically between about 30 nm and about 70 nm, and even more typically between about 40 nm and about 60 nm. In one example, the thickness of the layer containing the TCO areas and the dielectric filling may be about 50 nm. The values of the thickness correspond to the values of the thickness of the mere TCO layer. The first dielectric material deposited between the TCO areas is substantially not provided above the TCO areas. However, exceptions may be contaminations or particles left over from the removing step described above. Substantially, the patterned TCO layer and the first dielectric material form a layer having a uniform optical appearance, especially having the above referred thickness.

The layer stack according to embodiments described herein, the touch panel including a layer stack according to embodiments described herein and the method for forming a layer stack according to embodiments described herein provide a high transmittance and, at the same time, a low surface resistance. The TCO pattern is nearly or fully invisible in the antireflective layer stack. Thus, the touch panels including the herein described layer stack have an improved optical appearance while the conductive layer is provided on a polymer substrate, which, in some embodiments, only allows a layer deposition at limited temperature.

The written description uses examples to disclose the invention, including the best mode, and to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other.

While the foregoing is directed to embodiments of the invention, other and further embodiments of the invention may be devised without departing from the basic scope thereof, and the scope thereof is determined by the claims that follow.

The invention claimed is:

1. Method for forming a layer stack for a touch panel, the method comprising:
depositing a layer of transparent conductive oxide on a substrate comprising a polymer;
patterning the layer of transparent conductive oxide so as to form gaps between areas of transparent conductive oxide;
filling the gaps between the areas of transparent conductive oxide with a first dielectric material, wherein the first dielectric material comprises at least one of $Si_3N_4$, $Ta_2O_5$, $ZrO_2$, $ZnO$, $SnO_2$, or materials having the formula $SiN_xO_y$, and wherein the first dielectric material forms a continuous layer directly on the layer of transparent conductive oxide and in the gaps between areas of the transparent conductive oxide;
removing the first dielectric material deposited directly on the areas of transparent conductive oxide of the patterned layer of transparent conductive oxide; and
providing a dielectric layer directly on the areas of transparent conductive oxide and directly on the first dielectric material.

2. The method according to claim 1, wherein the filling the gaps with a first dielectric material comprises choosing a dielectric material having at least one of about the same refractive index as the layer of transparent conductive oxide and about the same extinction coefficient as the layer of transparent conductive oxide.

3. The method according to claim 1, wherein depositing the layer of transparent conductive oxide on the substrate comprises depositing the layer of transparent conductive oxide on the substrate comprising at least one of a flexible substrate, a thermoplastic substrate, a foil, and a PET foil.

4. The method according to claim 1, wherein the method, before depositing the layer of transparent conductive oxide, further comprises:
depositing an adhesion layer directly on the substrate;
depositing a first high refractive index layer on the adhesion layer;
depositing a first low refractive index layer on the first high refractive index layer; and
depositing a second high refractive index layer on the first low refractive index layer.

5. The method according to claim 1, further comprising:
depositing a contact layer on the layer of transparent conductive oxide before patterning the layer transparent conductive oxide;
patterning the layer of transparent conductive oxide and the contact layer before the filling the gaps between the areas of transparent conductive oxide with a first dielectric material.

6. The method according to claim 5, wherein the contact layer is a copper layer.

7. Method for forming a layer stack for a touch panel, the method comprising:
depositing a layer of transparent conductive oxide on a substrate comprising a polymer;
patterning the layer of transparent conductive oxide so as to form gaps between areas of transparent conductive oxide;
filling the gaps between the areas of transparent conductive oxide with a first dielectric material, wherein the first dielectric material comprises at least one of $Si_3N_4$, $Ta_2O_5$, $ZrO_2$, $ZnO$, and $SnO_2$, and wherein the first dielectric material forms a continuous layer directly on the layer of transparent conductive oxide and in the gaps between areas of the transparent conductive oxide;
removing the first dielectric material deposited directly on the areas of transparent conductive oxide of the patterned layer of transparent conductive oxide; and
providing a dielectric layer directly on the areas of transparent conductive oxide and directly on the first dielectric material.

8. The method according to claim 7, wherein the filling the gaps with a first dielectric material comprises choosing a dielectric material having at least one of about the same refractive index as the layer of transparent conductive oxide and about the same extinction coefficient as the layer of transparent conductive oxide.

9. The method according to claim 7, wherein depositing the layer of transparent conductive oxide on the substrate comprises depositing the layer of transparent conductive oxide on the substrate comprising at least one of a flexible substrate, a thermoplastic substrate, a foil, and a PET foil.

10. The method according to claim 7, wherein the method, before depositing the layer of transparent conductive oxide, further comprises:
depositing an adhesion layer directly on the substrate;
depositing a first high refractive index layer on the adhesion layer;
depositing a first low refractive index layer on the first high refractive index layer; and
depositing a second high refractive index layer on the first low refractive index layer.

11. The method according to claim 7, further comprising:
depositing a contact layer on the layer of transparent conductive oxide before patterning the layer transparent conductive oxide;
patterning the layer of transparent conductive oxide and the contact layer before the filling the gaps between the areas of transparent conductive oxide with a first dielectric material.

12. The method according to claim 11, wherein the contact layer is a copper layer.

* * * * *